(12) United States Patent
Watanabe (10) Patent No.: US 10,388,683 B2
(45) Date of Patent: Aug. 20, 2019

(54) SEMICONDUCTOR DEVICE AND METHOD OF MANUFACTURING SEMICONDUCTOR DEVICE

(71) Applicant: SONY CORPORATION, Tokyo (JP)

(72) Inventor: Tsuyoshi Watanabe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 51 days.

(21) Appl. No.: 14/850,058

(22) Filed: Sep. 10, 2015

(65) Prior Publication Data

US 2015/0380452 A1    Dec. 31, 2015

Related U.S. Application Data

(63) Continuation of application No. 14/151,028, filed on Jan. 9, 2014, now Pat. No. 9,166,070.

(30) Foreign Application Priority Data

Jan. 17, 2013 (JP) ................................. 2013-006533

(51) Int. Cl.
*H01L 27/146* (2006.01)
*H01L 31/0203* (2014.01)

(52) U.S. Cl.
CPC .... *H01L 27/14618* (2013.01); *H01L 31/0203* (2013.01); *H01L 2224/16* (2013.01)

(58) Field of Classification Search
None
See application file for complete search history.

(56) References Cited

U.S. PATENT DOCUMENTS

| | | | |
|---|---|---|---|
| 5,696,031 A | 12/1997 | Wark | |
| 6,713,857 B1* | 3/2004 | Tsai | H01L 21/568 257/686 |
| 2005/0185088 A1* | 8/2005 | Kale | H01L 27/14618 348/374 |
| 2008/0083964 A1* | 4/2008 | Fujimoto | H01L 27/14618 257/432 |
| 2009/0265028 A1* | 10/2009 | Sri-Jayantha | H05K 3/0005 700/121 |
| 2009/0315130 A1* | 12/2009 | Ro | H01L 27/14618 257/432 |
| 2010/0321563 A1* | 12/2010 | Kume | H01L 27/14618 348/374 |
| 2012/0008025 A1* | 1/2012 | Sasano | H01L 27/14618 348/294 |

FOREIGN PATENT DOCUMENTS

| | | |
|---|---|---|
| JP | 2004-006564 A | 8/2004 |
| JP | 2012-009547 A | 1/2012 |

* cited by examiner

*Primary Examiner* — Matthew L Reames
*Assistant Examiner* — Steven B Gauthier
(74) *Attorney, Agent, or Firm* — Chip Law Group (57) ABSTRACT

A semiconductor device includes an organic substrate, an integrated circuit, a chip part, a molded section and a solid-state image pickup element. The integrated circuit and the chip part are on the organic substrate. The molded section, including a central portion and a peripheral portion, form a concave shape. The central portion seals the integrated circuit and the chip part. The peripheral portion is around the central portion. The solid-state image pickup element is on the central portion of the molded section. The solid-state image pickup element has a top edge that is lower in position in a thickness direction than a top edge of the peripheral portion of the molded section.

17 Claims, 8 Drawing Sheets

SEMICONDUCTOR DEVICE AND METHOD OF MANUFACTURING SEMICONDUCTOR DEVICE

CROSS REFERENCE TO RELATED APPLICATIONS

The present application is a continuation application of U.S. patent application Ser. No. 14/151,028, filed Jan. 9, 2014, which claims priority from Japanese Patent Application JP 2013-006533 filed on Jan. 17, 2013, the entire contents of which are incorporated herein by reference.

BACKGROUND

The present technology relates to a semiconductor device and to a method of manufacturing the semiconductor device. In particular, the present technology relates to a semiconductor device and a method of manufacturing a semiconductor device that are capable of decreasing influence of thermal noise by decreasing the external dimensions, decreasing the thickness, and increasing heat radiation efficiency to suppress temperature elevation of a solid-state image pickup element.

In recent years, as smartphones, tablet devices, etc. have been miniaturized, semiconductor devices such as a semiconductor package and a semiconductor module that are built into the smartphones, the tablet devices, etc. have been increasingly miniaturized.

For the semiconductor devices, a method capable of surface mounting in which a solid-state image pickup element is bonded, with the use of resin, onto an IC that is flip-chip-mounted on a substrate, and no additional substrate is necessitated has been proposed (see United States Patent Application Publication No. 005696031A).

However, in the foregoing method, since heat generated from the IC is transferred to the solid-state image pickup element, electric characteristics of a solid-state image pickup device may be degraded.

Therefore, a method of suppressing transfer of heat generated from an IC to a solid-state image pickup element by bonding a spacer to the top surface of the IC and bonding the solid-state image pickup element thereto with the use of a resin has been proposed (see Japanese Unexamined Patent Application Publication No. 2004-006564).

However, in the foregoing method, it is necessary to previously prepare a sheet-like thermal-insulating synthetic adhesive. In addition thereto, a step of precisely attaching and hardening the adhesive is necessitated. Therefore, manufacturing materials and the number of manufacturing steps may be increased.

Therefore, a method of providing cavities on both surfaces of a ceramic substrate or an organic substrate and containing each of a solid-state image pickup element and an IC therein has been proposed (see Japanese Unexamined Patent Application Publication No. 2012-009547 (JP2012-009547A)).

SUMMARY

However, in the technology disclosed in JP2012-009547A, upon mounting the solid-state image pickup element and the IC, it is necessary to secure intensity of a layer between the solid-state image pickup element and the IC. In addition thereto, since wirings for the solid-state image pickup element and the IC are concentrated, the thickness of the layer is less likely to be decreased, leading to incapability of decreasing the thickness of a package.

Further, in order to decrease the thickness of a package, a method of providing steps in a cavity, mounting an IC on the lowermost surface, and subsequently containing a solid-state image pickup element in a step thereabove has been proposed. However, such a method is less likely to be achieved unless the size of the IC is significantly decreased compared to the size of the solid-state image pickup element, and therefore, a practical-sized IC is not allowed to be mounted.

It is desirable to achieve, in particular, suppression of degradation in image quality due to thermal noise by decreasing the external dimensions and the thickness of a resin sealing an IC and chip parts that are provided on an organic substrate and increasing heat radiation efficiency to suppress temperature elevation of an arranged solid-state image pickup element.

According to an embodiment of the present technology, there is provided a semiconductor device including: an organic substrate; an integrated circuit and a chip part provided on the organic substrate; a molded section including a central portion and a peripheral portion, and forming, as a whole, a concave shape, the central portion sealing the integrated circuit and the chip part on the organic substrate, and the peripheral portion standing around the central portion; and a solid-state image pickup element provided on the central portion of the molded section, the solid-state image pickup element having a top edge that is lower in position in a thickness direction than a top edge of the peripheral portion of the molded section.

The central portion of the molded section may be connected to the peripheral portion of the molded section to allow heat generated from the integrated circuit to be transferred from the central portion of the molded section to the peripheral portion of the molded section.

The central portion of the molded section may be connected to the peripheral portion of the molded section at two points that are located symmetrically with respect to a central position of the organic substrate.

The molded section may be made of mold resin having high heat conductivity, and allowing heat generated from the integrated circuit to be easily transferred from the central portion of the molded section to the peripheral portion of the molded section.

The mold resin may include one of liquid crystal polymer and epoxy-based thermosetting resin containing filler.

A glass section to be bonded to the top edge, as a whole, of the peripheral portion may be further provided. Further, the molded section with the concave shape and the glass section may form a cavity structure that contains the solid-state image pickup element.

The molded section may further include a step portion along the peripheral portion, the step portion having a top edge that is, in position in the thickness direction, higher than the top edge of the central portion and lower than the top edge of the peripheral portion. The solid-state image pickup element may have a peripheral portion that is in contact with the top edge of the step portion, and a central portion that is away from the molded section. An air layer may be formed between the molded section and the solid-state image pickup element.

The molded section may include an air hole running through between the integrated circuit and the solid-state image pickup element.

The molded section may include a heat radiation fin in an outer portion of the peripheral section.

The integrated circuit may be a chip size package (CSP), may be soldered to the organic substrate, and may be sealed together with the chip part by the molded section.

According to an embodiment of the present technology, there is provided a method of manufacturing a semiconductor device, the method including: providing an organic substrate; providing an integrated circuit and a chip part on the organic substrate; forming a molded section including a central portion and a peripheral portion, and forming, as a whole, a concave shape, the central portion sealing the integrated circuit and the chip part on the organic substrate, and the peripheral portion standing around the central portion; and providing a solid-state image pickup element on the central portion of the molded section, the solid-state image pickup element having a top edge that is lower in position in a thickness direction than a top edge of the peripheral portion of the molded section.

In the above-described embodiments of the present technology, the semiconductor device includes: the organic substrate; the integrated circuit and the chip part provided on the organic substrate; the molded section including the central portion and the peripheral portion, and forming, as a whole, the concave shape, the central portion sealing the integrated circuit and the chip part on the organic substrate, and the peripheral portion standing around the central portion; and the solid-state image pickup element provided on the central portion of the molded section, the solid-state image pickup element having the top edge that is lower in position in the thickness direction than the top edge of the peripheral portion of the molded section.

According to the above-described embodiments of the present technology, degradation in image quality due to thermal noise is allowed to be suppressed by decreasing the external dimensions and the thickness of the resin sealing the IC and the chip parts that are provided on the organic substrate and increasing heat radiation efficiency to suppress temperature elevation of the arranged solid-state image pickup element.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Some embodiments for carrying out the present technology (referred to as "embodiment(s)" below) will be described below. The description will be given in the following order.
1. First Embodiment (an example in which a peripheral portion is molded so that a central portion becomes a concave portion)
2. Modification 1 (an example in which molding is performed so that a peripheral portion has a two-step structure)
3. Modification 2 (an example in which a through-air-hole is provided under a solid-state image pickup element)
4. Modification 3 (an example in which heat radiation fins are provided in a peripheral portion)
5. Modification 4 (an example in which a front-end IC is configured of a CSP)

1. First Embodiment

Configuration Example of Solid-State Image Pickup Device

Figure 1:
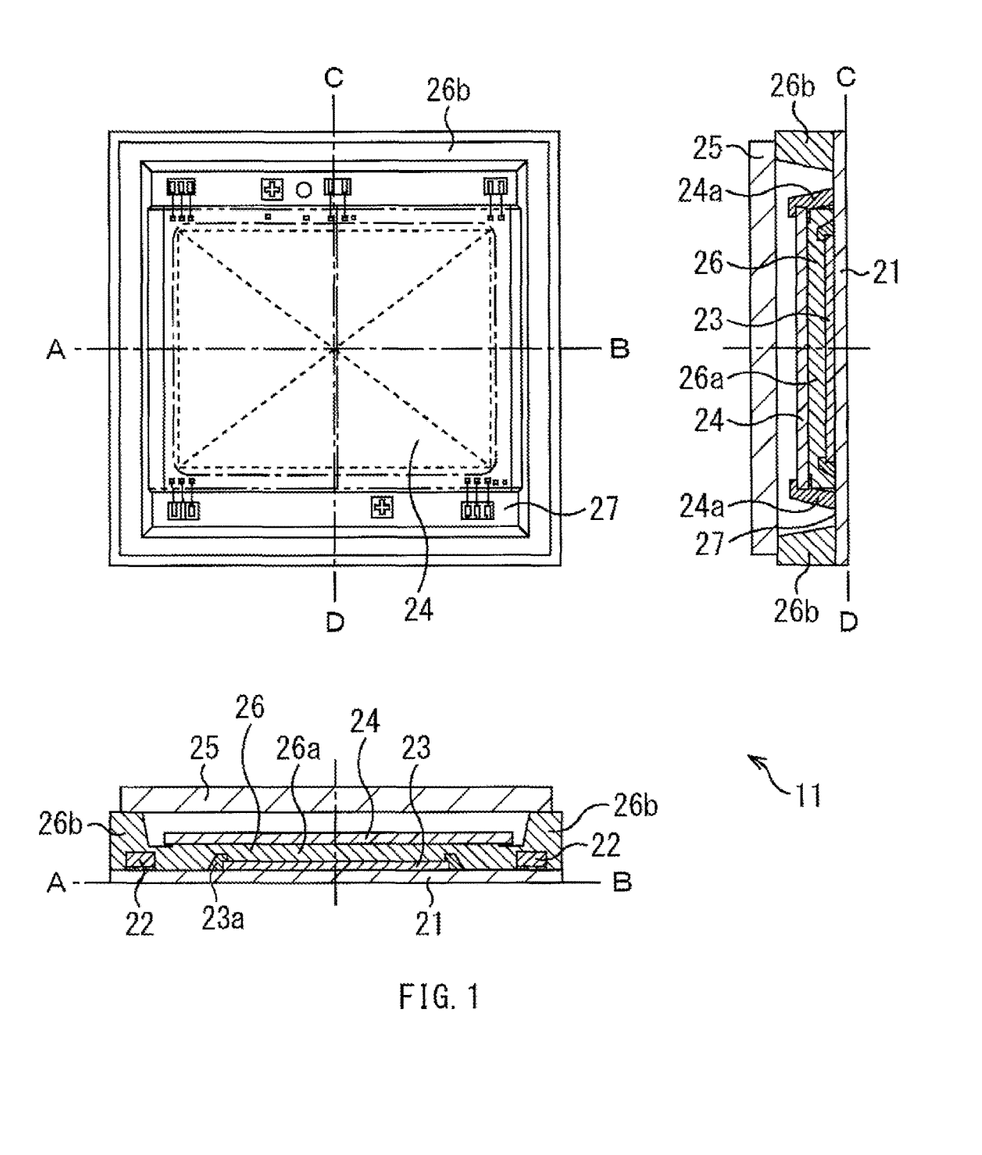
FIG. 1 illustrates diagrams illustrating an external configuration example of a solid-state image pickup device according to a first embodiment of the present technology.

FIG. 1 illustrates diagrams illustrating an external configuration example of a solid-state image pickup device according to an embodiment of the present technology. In FIG. 1, a top-left part is a top view of the solid-state image pickup device, a bottom-left part is a cross-sectional view taken along a line A-B in the top-left part, and a top-right part is a cross-sectional view taken along a line C-D in the top-left part.

The solid-state image pickup device in FIG. 1 is generally called an image sensor or the like, and is a part built into an image pickup apparatus that picks up an image such as a moving image and a still image. The solid-state image pickup device picks up an image by light entering through an unillustrated optical block and/or the like, and outputs the picked-up image as image data.

More specifically, a solid-state image pickup device 11 in FIG. 1 includes an organic substrate 21, chip parts 22, a front-end IC (Integrated Circuit) 23, a solid-state image pickup element 24, and a glass section 25.

It is to be noted that the following description will be given on the condition that the organic substrate 21 is located in the lowermost layer, and the glass section 25 is located in the uppermost layer. Therefore, upper and lower directions are based on the cross-sectional views in FIG. 1. A direction in which the organic substrate 21 is provided in the solid-state image pickup device 11 is regarded as the lower direction, and a direction in which the glass section 25 is provided is regarded as the upper direction. Therefore, for example, the glass section 25 is provided above the organic substrate 21. In contrast, the organic substrate 21 is provided below the glass section 25.

The solid-state image pickup device 11 includes the organic substrate 21 with both surfaces provided with fine wiring patterns in the lowermost layer. The above-mentioned various sections are formed on the organic substrate 21.

Specifically, as illustrated in an outer portion (peripheral portion) of the organic substrate 21 located in right and left portions in the cross-sectional view taken along the line A-B, each of the chip parts 22 including a resistance, a condenser, and a transistor is arranged on the organic substrate 21. Further, in the central portion of the organic substrate 21, the front-end IC 23 that processes a signal of an image picked-up by the solid-state image pickup element 24 is arranged. A main body of the front-end IC 23 is bonded onto the organic substrate 21 with a thermosetting adhesive, and the front-end IC 23 is electrically connected to the organic substrate 21 through the wiring pattern on the organic substrate 21 and a wire bonding section 23a such as a gold wire.

Further, the chip parts 22 and the front-end IC 23 are sealed by a mold resin in a state that the chip parts 22 and the front-end IC 23 are connected to the organic substrate 21. Further, a molded section 26 is formed of the mold resin. The molded section 26 includes a central portion 26a that mainly seals the front-end IC 23, and an embankment-like peripheral portion 26b that is higher than the central portion 26a and is arranged to surround the organic substrate 21. More specifically, since the peripheral portion 26b is higher than the central portion 26a in the upper direction, and is arranged to surround the organic substrate 21, the molded section 26 is formed in a state of a concave as a whole. The solid-state image pickup element 24 is arranged on the central portion 26a of the molded section 26. As illustrated in the top-left part and the top-right part of FIG. 1, the molded section 26 is provided with a concave section 27 to connect wire bonding portions 24a that electrically connect the solid-state image pickup element 24 with the organic substrate 21. As illustrated in the top-left part of FIG. 1, the concave section 27 is formed as a depressed area that is extended in the horizontal direction and is provided in upper and lower portions.

Further, on a top edge of the peripheral portion 26b of the molded section 26, the glass section 25 that has the substantially same shape as the outer shape of the top edge of the peripheral portion 26b and that has a size slightly smaller than the whole area of the top edge of the peripheral portion 26b is provided. The whole upper surface of the central portion 26a of the molded section 26 is located lower than an upper surface of the peripheral portion 26b so that the bottom surface portion of the glass section 25 is not in contact with the top surface portion of the solid-state image pickup element 24 even when the glass section 25 is arranged on the top edge of the peripheral portion 26b after the solid-state image pickup element 24 is arranged on the top portion of the central portion 26a.

In other words, the solid-state image pickup device 11 in FIG. 1 includes the organic substrate 21, the glass section 25, and the molded section 26 provided between the organic substrate 21 and the glass section 25. The molded section 26 and the glass section 25 configure a cavity structure. The cavity structure contains the solid-state image pickup element 24. The central portion 26a of the molded section 26 seals the front-end IC 23. The solid-state image pickup element 24 is provided on the central portion 26a of the molded section.

Due to such a structure, when the solid-state image pickup device 11 is driven, heat generated from the front-end IC 23 is radiated through the resin having high heat-radiation characteristics that forms the molded section 26. Therefore, thermal noise with respect to the solid-state image pickup element 24 is decreased. For example, in the case where a resin with high heat-radiation effect such as an epoxy-based thermosetting resin containing a filler and a liquid crystal polymer is used as a resin forming the molded section 26, and color of such a resin is black with less surface reflection, heat may be allowed to be radiated more effectively.

Further, by arranging the chip parts 22 on the organic substrate 21 so that space efficiency becomes favorable, the outer circumference of the peripheral portion 26b is decreased. As a result, the whole size of the solid-state image pickup device 11 is decreased.

In particular, in the case where the solid-state image pickup element 24 is larger than the front-end IC 23, by arranging the chip parts 22 close to the periphery of the front-end IC 23, the front-end IC 23 and the chip parts 22 as a whole are allowed to be arranged under the solid-state image pickup element 24. This leads to improvement in space efficiency. As a result, the outer circumference of the peripheral portion 26b is further decreased, and the whole size of the solid-state image pickup device 11 is further decreased.

Further, in the case where a part having large height is included in the chip parts 22, by arranging such a part 22 on the organic substrate 21 to be sealed within the peripheral portion 26b of the molded section 26, the thickness of the central portion 26a is decreased, and the thickness of the solid-state image pickup device 11 is decreased as a whole.

[Manufacturing Processes of Solid-State Image Pickup Device]

Figure 2:
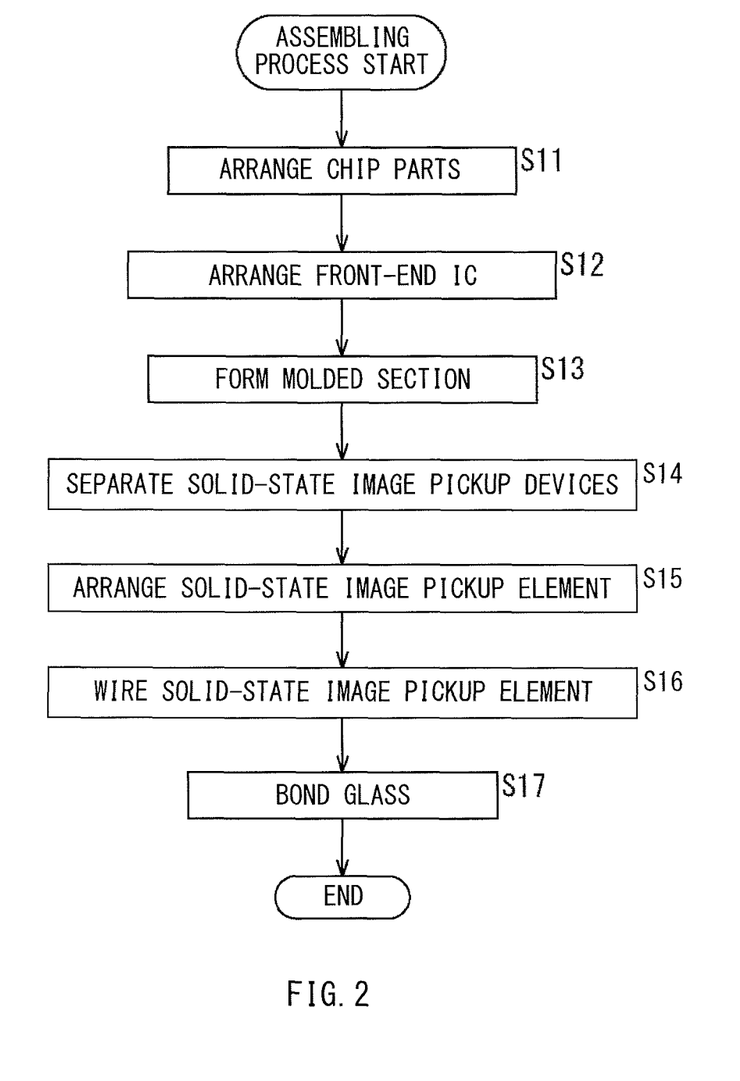
FIG. 2 is a flowchart explaining manufacturing processes of the solid-state image pickup device of FIG. 1.

Next, description will be given of manufacturing processes of the solid-state image pickup device 11 of FIG. 1 referring to a flowchart of FIG. 2.

In step S11, each of the chip parts 22 is arranged in a predetermined position on the organic substrate 21. That is, as illustrated in a state B of FIG. 3, the predetermined chip parts 22 are arranged on the organic substrate 21 with the both surfaces provided with the wiring patterns illustrated in a state A of FIG. 3. It is to be noted that, in FIG. 3, states of the solid-state image pickup device 11 in respective process steps are illustrated as steps A to G from the top column. The left parts of FIG. 3 correspond to the cross-sectional view taken along the line A-B in FIG. 1, and the right parts of FIG. 3 correspond to the cross-sectional view taken along the line C-D in FIG. 1. Further, in FIG. 3, illustration corresponding to the cross-sectional view taken along the line C-D is omitted for the states A to C.

In step S12, the front-end IC 23 is arranged in the substantially central position on the organic substrate 21. That is, as illustrated in the state C of FIG. 3, the main body of the front-end IC 23 is bonded with a thermosetting adhesive in the central position on the organic substrate 21 on which the chip parts 22 are arranged illustrated in the state B of FIG. 3, and the front-end IC 23 is electrically connected to the wiring pattern on the organic substrate 21 through the wire bonding section 23a made of a gold wire or the like.

Figure 3:
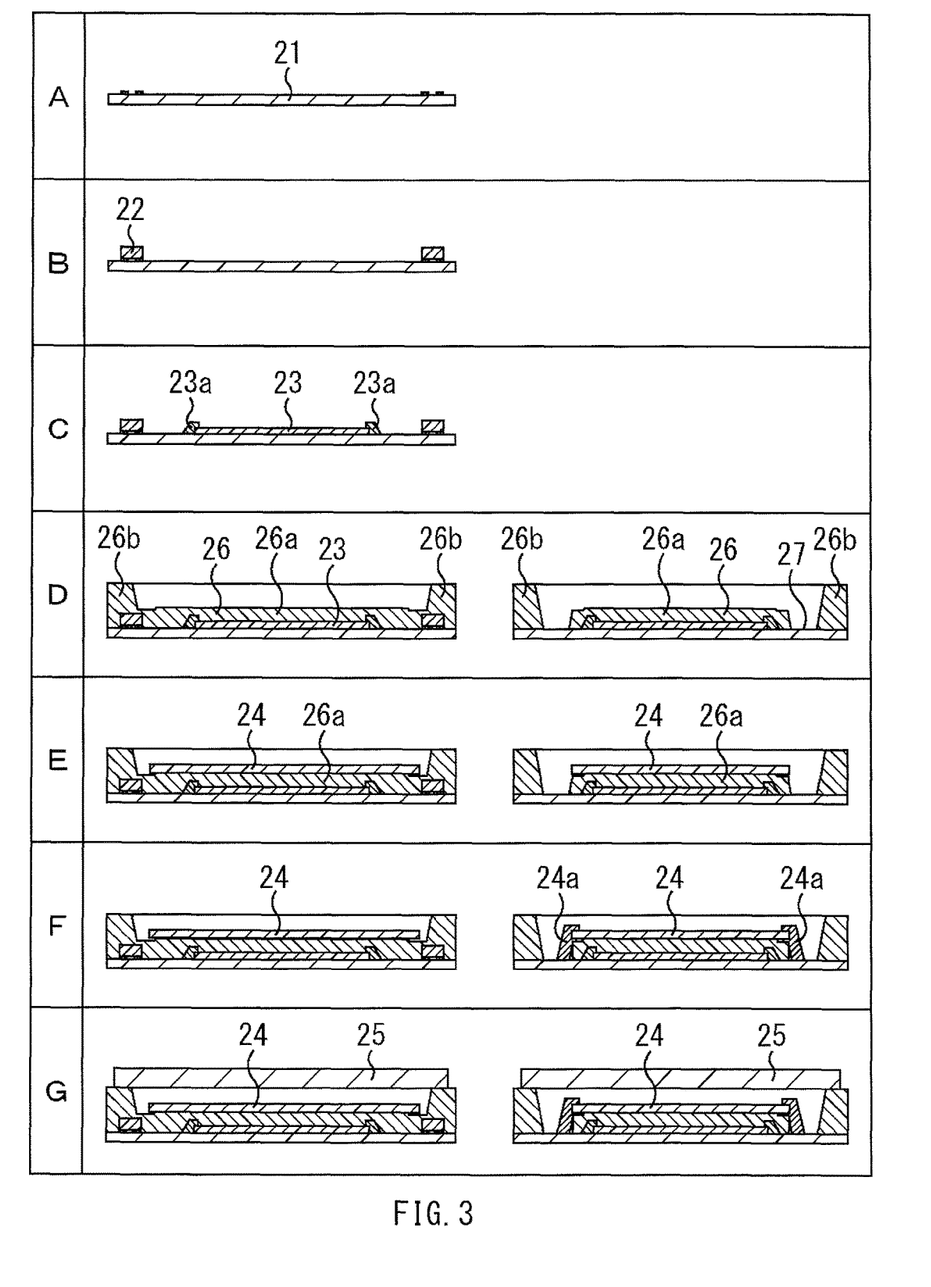
FIG. 3 illustrates diagrams explaining the manufacturing processes of the solid-state image pickup device of FIG. 1.
Figure 4:
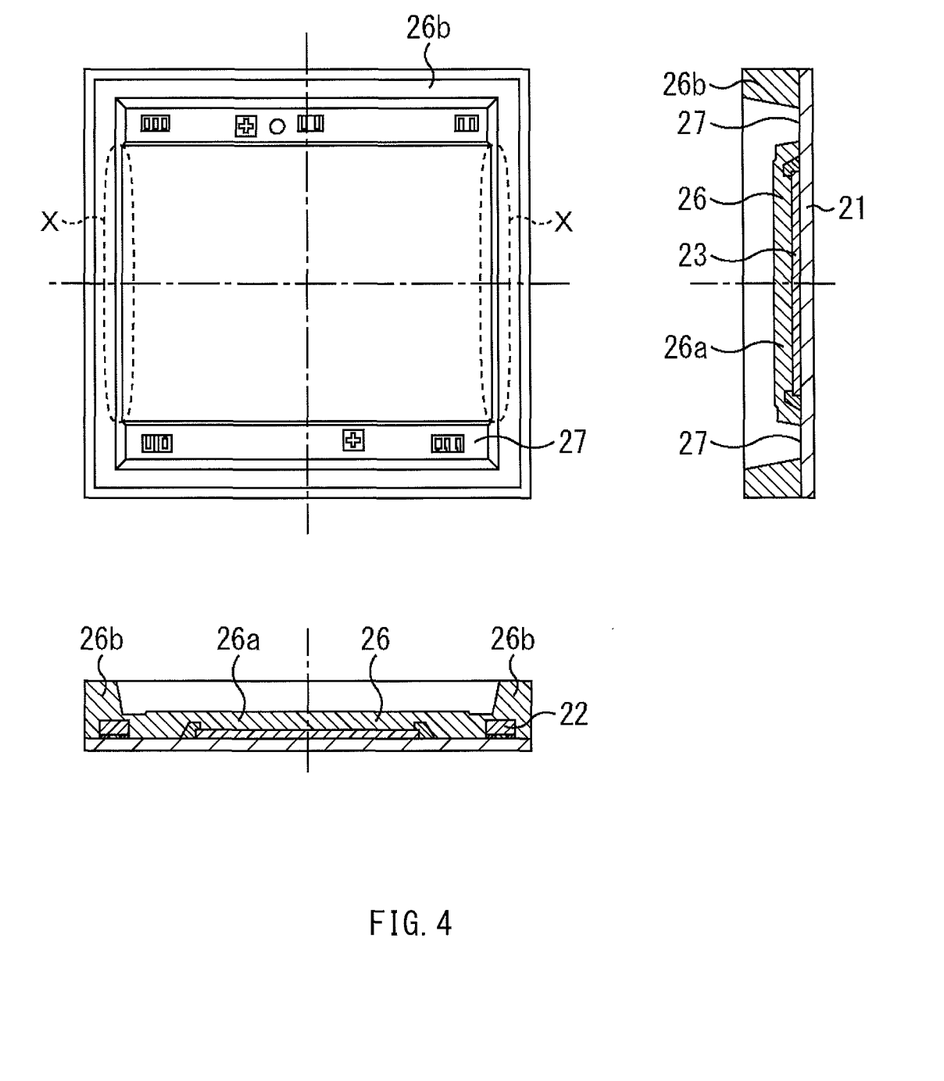
FIG. 4 illustrates diagrams explaining a molded section.

In step S13, as illustrated in the state D of FIG. 3, the molded section 26 including the central portion 26a and the peripheral portion 26b is formed. At this time, one pair of sides of the central portion 26a forming a square are connected to the peripheral portion 26b at connection sections X (in FIG. 4). The connection sections X are located symmetrically with respect to the central position of the organic substrate 21 indicated by dotted lines in FIG. 4. The other pairs of sides of the central portion 26a are away from the peripheral portion 26b, and the concave sections 27 where the organic substrate is exposed are provided between the central portion 26a and the peripheral portion 26b.

Figure 5:
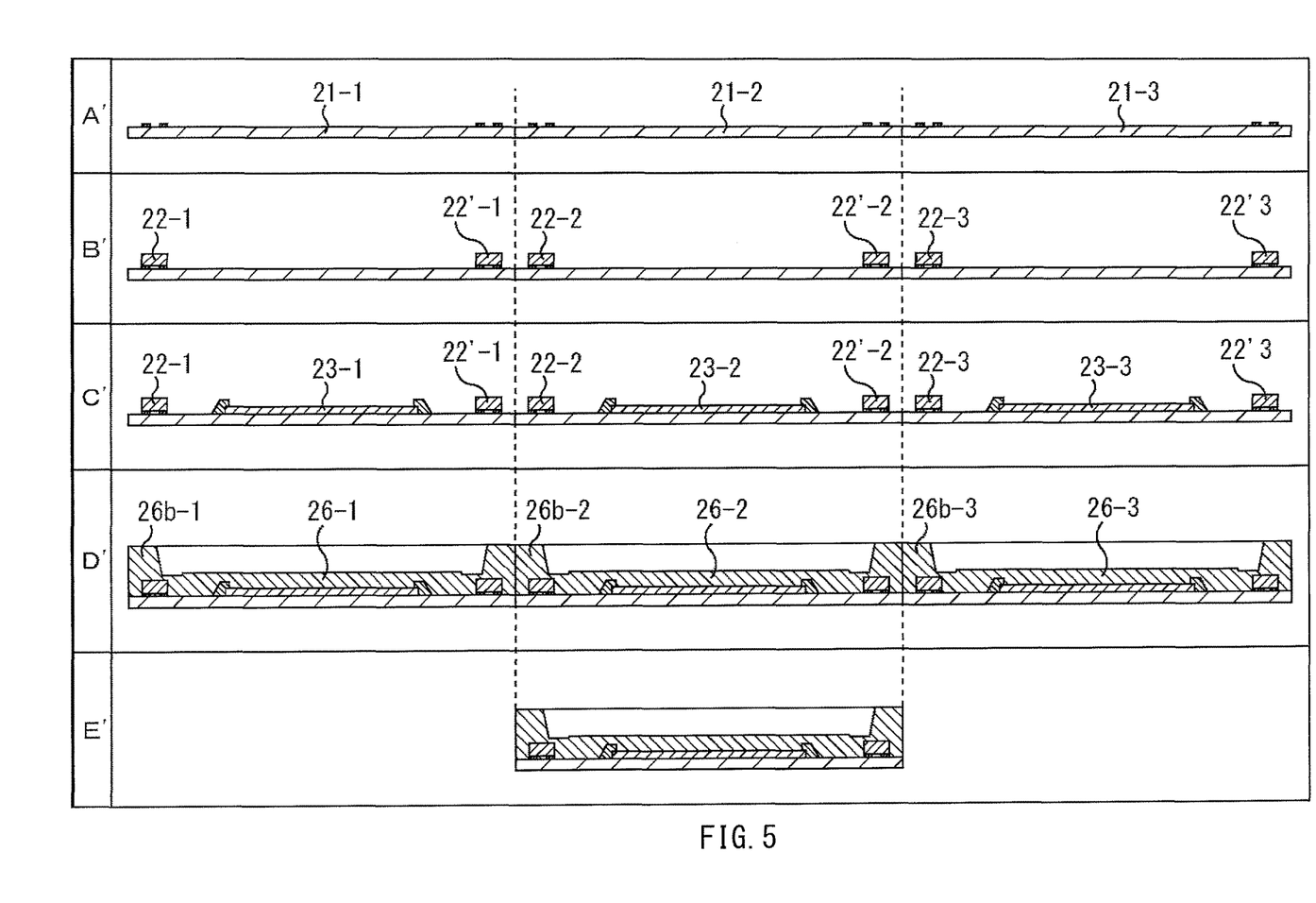
FIG. 5 illustrates diagrams explaining manufacturing processes of the solid-state image pickup device of FIG. 1 with the use of an aggregate substrate.

It is to be noted that the foregoing series of processes are processes performed on each of a plurality of solid-state image pickup devices 11 in an aggregate substrate including the plurality of solid-state image pickup devices 11 as illustrated in FIG. 5. That is, by the process of the step S11, as illustrated in a state B' of FIG. 5, chip parts 22-1 to 22-3 and 22'-1 to 22'-3 are arranged on respective organic substrates 21-1 to 21-3 configuring the aggregate substrate illustrated in a state A' of FIG. 5. Next, by the process of the step S12, as illustrated in a state C' of FIG. 5, front-end ICs 23-1 to 23-3 are arranged in respective central portions of the respective organic substrates 21-1 to 21-3 on which the chip parts 22-1 to 22-3 and 22'-1 to 22'-3 are arranged as illustrated in the state B' of FIG. 5. Subsequently, by the process of the step S13, as illustrated in a state D' of FIG. 5, molded sections 26-1 to 26-3 are formed on the organic substrates 21-1 to 21-3 on which the front-end ICs 23-1 to 23-3 are arranged as illustrated in the state C' of FIG. 5. It is to be noted that shapes of the states A' to D' are similar to those of the states A to D illustrated in FIG. 3, and therefore, descriptions thereof are omitted. Further, although an example of manufacturing processes of three solid-state image pickup devices 11 is illustrated in FIG. 5, it goes without saying that an aggregate substrate including other number of solid-state image pickup devices 11 may be adopted. Further, in FIG. 5, diagrams correspond to the cross-sectional view taken along the line A-B in FIG. 1 are only illustrated as the states A' to E'.

In step S14, the plurality of solid-state image pickup devices 11 formed on the aggregate substrate that are illustrated in the state D' of FIG. 5 may be separated as illustrated in the state E' of FIG. 5 by, for example, dicing. By separating the plurality of solid-state image pickup devices 11 in such a manner, while the molded section 26 is formed as illustrated in the state D' of FIG. 3, the plurality of solid-state image pickup devices 11 are separated from each other. It is to be noted that, while the description has been given above of the case in which processes are performed on the aggregate substrate, it goes without saying that each of the solid-state image pickup devices 11 may be manufactured individually. Therefore, in the case where each of the solid-state image pickup devices 11 is manufactured individually, the process of the step S14 is skipped.

In step S15, as illustrated in the state E of FIG. 3, the solid-state image pickup element 24 is die-bonded with a thermosetting adhesive onto the central portion 26a of the molded section 26 as illustrated in the state D of FIG. 3.

In step S16, as illustrated in the state F of FIG. 3, by forming the wire bonding sections 24a of a gold line or the like, the solid-state image pickup element 24 is electrically connected to the wiring pattern on the organic substrate 21 exposed at the concave section 27.

In step S17, as illustrated in the state G of FIG. 3, the glass section 25 is positioned on the top edge of the peripheral portion 26b of the molded section 26 coated with an ultraviolet curable resin, a thermosetting resin, or the like, and then, ultraviolet ray or heat is applied thereto in a step-by-step manner. Thus, the ultraviolet curable resin or the thermosetting resin is cured, and the grass section 25 is bonded to the peripheral portion 26b of the molded section 26. As a result, the solid-state image pickup element 24 is contained in a space between the glass section 25 and the molded section 26 having the cavity structure.

In the solid-state image pickup device 11 manufactured by the foregoing processes, when the solid-state image pickup device 11 is driven, heat generated from the front-end IC 23 as a heat source is effectively transferred from the central portion 26a of the molded section 26 made of a mold resin having high heat conductivity to the peripheral portion 26b, and thereby, heat-radiation efficiency is improved. As a result, thermal noise of the solid-state image pickup element 24 is decreased.

Further, the molded section 26 is allowed to be formed easily even if the molded section 26 has a complicated shape. Moreover, the mold resin itself is inexpensive, and has high heat conductivity. Therefore, it is possible to achieve the solid-state image pickup device 11 that is low in cost, has high heat-radiation efficiency, and is less likely to be influenced by thermal noise.

2. Modification 1

Figure 6:
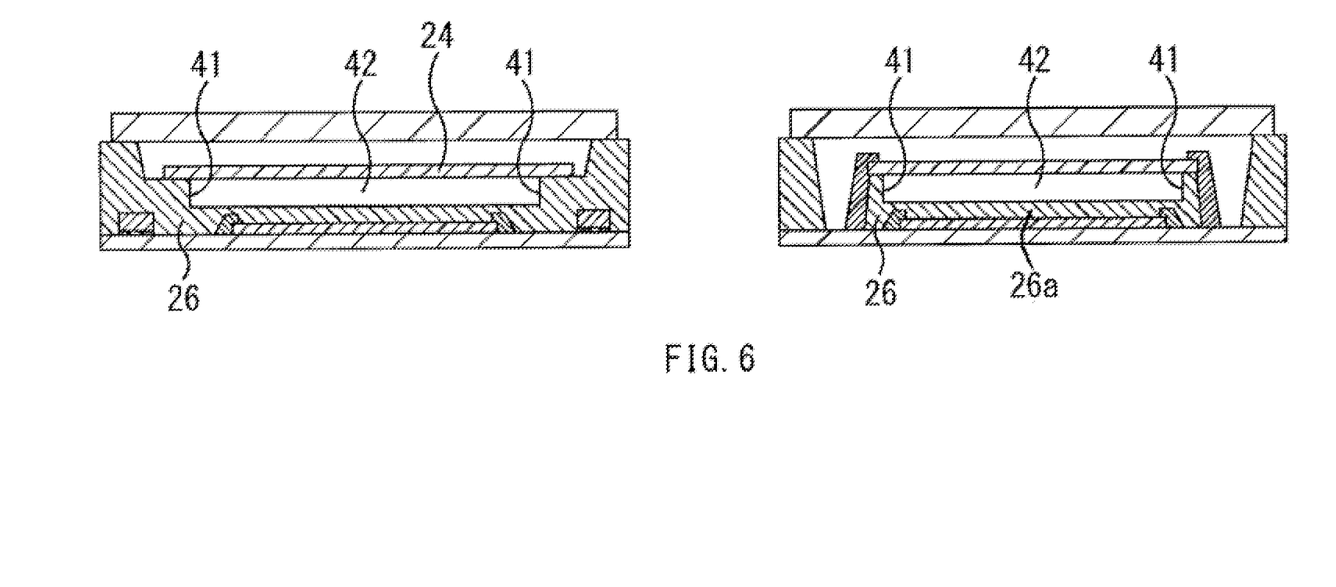
FIG. 6 illustrates diagrams illustrating an external configuration example of Modification 1 of the solid-state image pickup device according to the first embodiment of the present technology.

The description has been given above of the example in which the solid-state image pickup element 24 is arranged by directly die-bonding the solid-state image pickup element 24 onto the central portion 26a of the molded section 26. However, alternatively, as illustrated in FIG. 6, the following structure may be adopted. In the structure, the molded section 26 is formed by providing a step portion 41 so that a peripheral portion of the central portion 26a has a two-stage structure. Further, the solid-state image pickup element 24 is die-bonded only to the top edge formed of the step portion 41, and thereby, an air layer 42 is formed.

By the foregoing structure, a contact region between the central portion 26a of the molded section 26 provided on the front-end IC 23 as a heat source and the solid-state image pickup element 24 is decreased. Therefore, heat from the front-end IC 23 is less likely to be transferred to the solid-state image pickup element 24, and thermal noise of the solid-state image pickup element 24 is further decreased.

3. Modification 2

Figure 7:
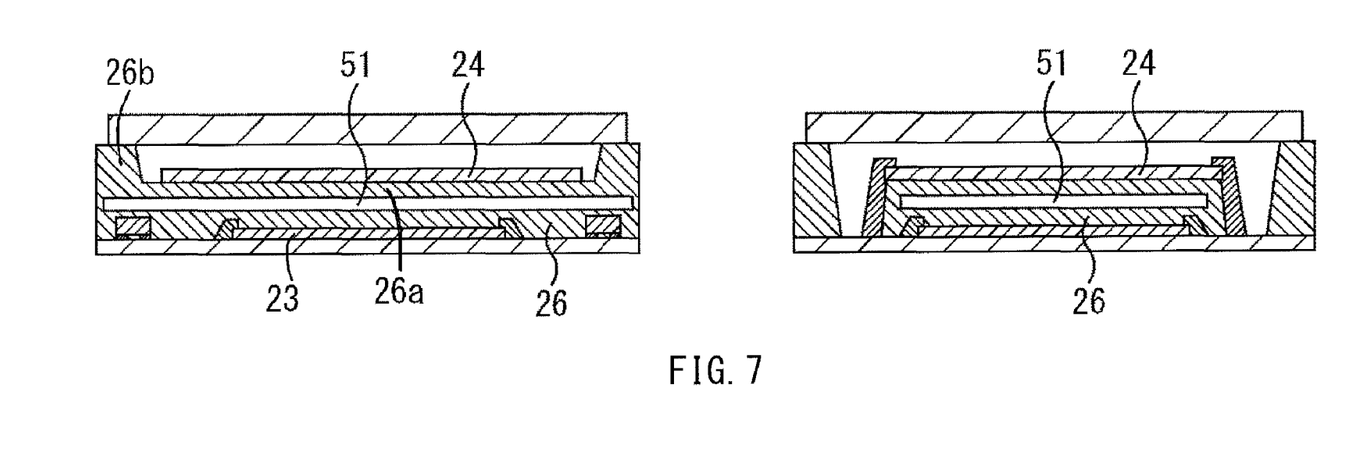
FIG. 7 illustrates diagrams illustrating an external configuration example of Modification 2 of the solid-state image pickup device according to the first embodiment of the present technology.

Alternatively, as illustrated in FIG. 7, the molded section 26 may have a structure including an air hole 51 that extends from one peripheral portion 26b to the other peripheral portion 26b via the central portion 26a.

By the foregoing structure, heat transferred from the central portion 26a of the molded section 26 provided on the front-end IC 23 as a heat source is cooled by air through the air hole 51. Therefore, heat from the front-end IC 23 is less likely to be transferred to the solid-state image pickup element 24, and thermal noise of the solid-state image pickup element 24 is further decreased.

4. Modification 3

Figure 8:
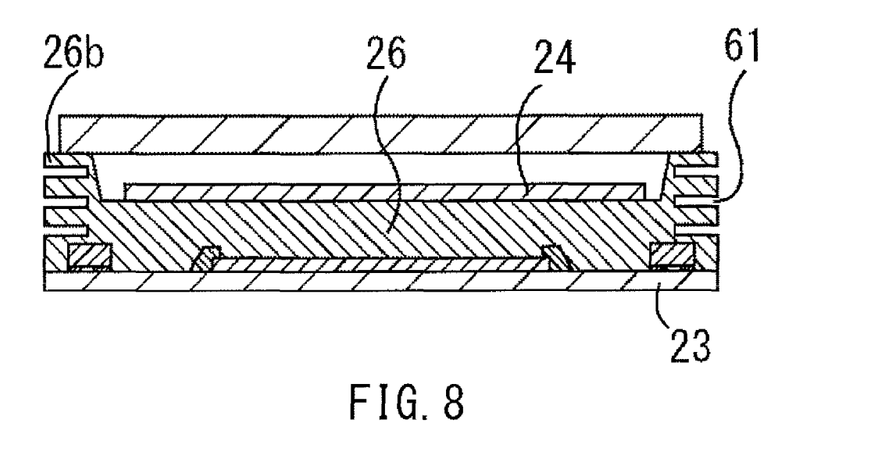
FIG. 8 illustrates a diagram illustrating an external configuration example of Modification 3 of the solid-state image pickup device according to the first embodiment of the present technology.

Alternatively, as illustrated in FIG. 8, heat radiation fins 61 may be formed on a side surface portion of the peripheral portion 26b of the molded section 26.

By the foregoing structure, the surface area of the molded section 26 becomes substantially increased by the fins 61. Therefore, heat from the front-end IC 23 transferred to the molded section 26 provided on the front-end IC 23 as a heat source is effectively radiated. Therefore, heat is less likely to be transferred to the solid-state image pickup element 24, and thermal noise of the solid-state image pickup element 24 is further decreased.

5. Modification 4

Figure 9:
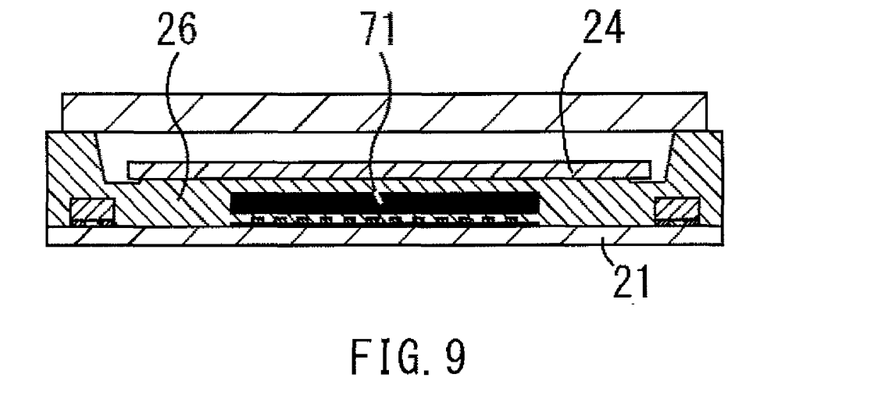
FIG. 9 illustrates a diagram illustrating an external configuration example of Modification 4 of the solid-state image pickup device according to the first embodiment of the present technology.

Alternatively, as illustrated in FIG. 9, instead of the normal front-end IC 23, a front-end IC 71 configured of a wafer-level CSP (Chip Size Package) may be provided, and the front-end IC 71 may be directly soldered to the wiring pattern of the organic substrate 21.

By the foregoing structure, heat from the front-end IC 71 as a heat source is effectively radiated to the organic substrate 21. Therefore, heat is less likely to be transferred to the solid-state image pickup element 24, and thermal noise of the solid-state image pickup element 24 is further decreased.

As described above, according to the above-described embodiments of the present technology, heat generated from the front-end IC as a heat source is effectively radiated. Therefore, thermal noise of the solid-state image pickup element 24 is decreased.

It is to be noted that the respective steps described in the foregoing flowchart may be executed by one device, or may be shared by a plurality of devices to be executed.

Further, in the case where a plurality of processes are included in one step, such a plurality of processes included in the one step may be executed by one device, or may be shared by a plurality of devices to be executed.

It is possible to achieve at least the following configurations from the above-described example embodiments and the modifications of the disclosure.

(1) A semiconductor device including:
  an organic substrate;
  an integrated circuit and a chip part provided on the organic substrate;
  a molded section including a central portion and a peripheral portion, and forming, as a whole, a concave shape, the central portion sealing the integrated circuit and the chip part on the organic substrate, and the peripheral portion standing around the central portion; and
  a solid-state image pickup element provided on the central portion of the molded section, the solid-state image pickup element having a top edge that is lower in position in a thickness direction than a top edge of the peripheral portion of the molded section.

(2) The semiconductor device according to (1), wherein the central portion of the molded section is connected to the peripheral portion of the molded section to allow heat generated from the integrated circuit to be transferred from the central portion of the molded section to the peripheral portion of the molded section.

(3) The semiconductor device according to (2), wherein the central portion of the molded section is connected to the peripheral portion of the molded section at two points that are located symmetrically with respect to a central position of the organic substrate.

(4) The semiconductor device according to (1), wherein the molded section is made of mold resin having high heat conductivity, and allowing heat generated from the integrated circuit to be easily transferred from the central portion of the molded section to the peripheral portion of the molded section.

(5) The semiconductor device according to (4), wherein the mold resin includes one of liquid crystal polymer and epoxy-based thermosetting resin containing filler.

(6) The semiconductor device according to (1), further including a glass section to be bonded to the top edge, as a whole, of the peripheral portion, wherein
  the molded section with the concave shape and the glass section form a cavity structure that contains the solid-state image pickup element.

(7) The semiconductor device according to (1), wherein
  the molded section further includes a step portion along the peripheral portion, the step portion having a top edge that is, in position in the thickness direction, higher than the top edge of the central portion and lower than the top edge of the peripheral portion,
  the solid-state image pickup element has a peripheral portion that is in contact with the top edge of the step portion, and a central portion that is away from the molded section, and
  an air layer is formed between the molded section and the solid-state image pickup element.

(8) The semiconductor device according to (1), wherein the molded section includes an air hole running through between the integrated circuit and the solid-state image pickup element.

(9) The semiconductor device according to (1), wherein the molded section includes a heat radiation fin in an outer portion of the peripheral section.

(10) The semiconductor device according to (1), wherein the integrated circuit is a chip size package (CSP), is soldered to the organic substrate, and is sealed together with the chip part by the molded section.

(11) A method of manufacturing a semiconductor device, the method including:
  providing an organic substrate;
  providing an integrated circuit and a chip part on the organic substrate;
  forming a molded section including a central portion and a peripheral portion, and
  forming, as a whole, a concave shape, the central portion sealing the integrated circuit and the chip part on the organic substrate, and the peripheral portion standing around the central portion; and
  providing a solid-state image pickup element on the central portion of the molded section, the solid-state image pickup element having a top edge that is lower in position in a thickness direction than a top edge of the peripheral portion of the molded section.

It should be understood by those skilled in the art that various modifications, combinations, sub-combinations and alternations may occur depending on design requirements and other factors insofar as they are within the scope of the appended claims or the equivalents thereof.

What is claimed is:
1. A semiconductor device, comprising:
  an organic substrate;
  an integrated circuit;
  a chip part, wherein the integrated circuit and the chip part are on the organic substrate, and wherein the chip part is separated from the integrated circuit;
  a molded section, wherein
    the molded section includes a central portion and a peripheral portion that is around the central portion,
    the molded section extends to contact the integrated circuit from a first edge of the integrated circuit to a second edge of the integrated circuit,
    the central portion of the molded section covers a central region of the integrated circuit,
    a first pair of sides of the central portion is connected to the peripheral portion, a second pair of sides of the central portion is separated by a first distance from the peripheral portion, and the second pair of sides is different from the first pair of sides; and a solid-state image pickup element on the central portion of the molded section, wherein a thickness of the solid-state image pickup element is less than a thickness of the peripheral portion of the molded section, and a thickness of the integrated circuit is less than the first thickness of the solid-state image pickup element.

2. The semiconductor device according to claim 1, wherein the thickness of the peripheral portion is larger than a fourth thickness of the central portion, and the integrated circuit is configured to generate heat and transfer the heat from the central portion of the molded section to the peripheral portion of the molded section.

3. The semiconductor device according to claim 2, wherein the central portion of the molded section is connected to the peripheral portion of the molded section at a plurality of points, and each point of the plurality of points is located at a symmetrical position with respect to a central position of the organic substrate.

4. The semiconductor device according to claim 1, wherein the molded section comprises a mold resin that has a heat conductivity, the integrated circuit is configured to generate heat, and the molded section is configured to transfer the heat from the central portion of the molded section to the peripheral portion of the molded section.

5. The semiconductor device according to claim 4, wherein the mold resin includes at least one of a liquid crystal polymer or an epoxy-based thermosetting resin, and the epoxy-based thermosetting resin contains filler.

6. The semiconductor device according to claim 4, wherein the mold resin is black in color.

7. The semiconductor device according to claim 1, further comprising a glass section bonded to the peripheral portion, wherein the molded section and the glass section comprise a cavity structure that contains the solid-state image pickup element.

8. The semiconductor device according to claim 1, wherein the molded section further includes a step portion along the peripheral portion, the step portion has a top edge, a position of the top edge of the step portion, in a thickness direction, is higher than a top edge of the central portion and lower than the top edge of the peripheral portion, the solid-state image pickup element has a peripheral portion that is in contact with the top edge of the step portion, and a central portion that is away from the molded section, and the semiconductor device further includes an air layer between the molded section and the solid-state image pickup element.

9. The semiconductor device according to claim 1, wherein the molded section further includes an air hole between the integrated circuit and the solid-state image pickup element.

10. The semiconductor device according to claim 1, wherein the molded section further includes a heat radiation fin in an outer portion of the peripheral portion.

11. The semiconductor device according to claim 1, wherein the integrated circuit is a chip size package (CSP), is soldered to the organic substrate, and is sealed together with the chip part by the molded section.

12. The semiconductor device according to claim 1, wherein the molded section has a concave shape.

13. The semiconductor device according to claim 12, wherein the concave shape is between the central portion of the molded section and the peripheral portion of the molded section.

14. The semiconductor device according to claim 1, wherein the integrated circuit is in a central position of the organic substrate, and the integrated circuit is configured to process an image received from the solid-state image pickup element.

15. The semiconductor device according to claim 1, wherein the chip part is at a second distance from a periphery of the integrated circuit.

16. The semiconductor device according to claim 1, wherein the chip part is sealed by the molded section.

17. A method, comprising:

forming an organic substrate;

forming an integrated circuit and a chip part on the organic substrate, wherein the chip part is separated from the integrated circuit;

forming a molded section, wherein the molded section includes a central portion and a peripheral portion that is around the central portion, the molded section extends to contact the integrated circuit from a first edge of the integrated circuit to a second edge of the integrated circuit, the central portion of the molded section covers a central region of the integrated circuit, a first pair of sides of the central portion is connected to the peripheral portion, a second pair of sides of the central portion is separated by a specific distance from the peripheral portion, and the second pair of sides is different from the first pair of sides; and bonding a solid-state image pickup element on the central portion of the molded section, wherein a thickness of the solid-state image pickup element is less than a thickness of the peripheral portion of the molded section, and a thickness of the integrated circuit is less than the first thickness of the solid-state image pickup element.

* * * * *